United States Patent [19]

Pitzen

[11] 4,391,014
[45] Jul. 5, 1983

[54] CLEANING WIPER

[75] Inventor: James F. Pitzen, Maplewood, Minn.

[73] Assignee: Minnesota Mining and Manufacturing Company, Saint Paul, Minn.

[21] Appl. No.: 311,055

[22] Filed: Oct. 13, 1981

[51] Int. Cl.³ .................... A47L 13/46; A47L 13/256
[52] U.S. Cl. .................... 15/231; 15/104 A; 51/361; 51/391
[58] Field of Search ............ 15/231, 232, 233, 104 A, 15/228; 51/359, 360, 361, 391, 392, 393

[56] References Cited

U.S. PATENT DOCUMENTS

| | | | |
|---|---|---|---|
| 899,725 | 9/1908 | Goodier | 15/231 |
| 1,410,014 | 12/1921 | Teitel . | |
| 1,857,633 | 5/1932 | Gramsa . | |
| 2,394,585 | 2/1946 | Bailey | 15/231 X |
| 2,430,060 | 11/1947 | Lamb et al. | 51/361 |
| 3,201,817 | 8/1965 | Atchley | 15/231 |
| 4,106,153 | 8/1978 | Lemelson . | |
| 4,112,536 | 9/1978 | Carson, Jr. et al. | 15/231 X |
| 4,121,315 | 10/1978 | Buser | 15/228 |

FOREIGN PATENT DOCUMENTS 499727  6/1930  Fed. Rep. of Germany .

*Primary Examiner*—Peter Feldman
*Attorney, Agent, or Firm*—Cruzan Alexander; Donald M. Sell; William D. Bauer

[57] ABSTRACT

A cleaning wiper adapted to automatically maintain a fresh cleaning surface upon each utilization. Supply and take-up holders are mounted in a body for holding rolls of a cleaning web. The cleaning web, intermediate the supply and take-up holders, passes over a support member movably mounted within and accessible through a slot in one side of the body. Utilization of the cleaning wiper causes the support member to be moved from its resiliently biased position within the slot and activates an advance linkage. The advance linkage advances the rotation of the take-up holder a predetermined amount.

8 Claims, 6 Drawing Figures

CLEANING WIPER

FIELD OF THE INVENTION

The present invention relates generally to cleaning wipers.

BACKGROUND OF THE INVENTION

There exists a need for a cleaning wiper to be utilized in the graphic arts, photographic, and printed circuit industries to clean sheet film, light tables, art work, printed circuit boards, and other sheets and other regular surfaces.

Brushes have been used for this purpose. However, brushes have significant shortcomings when utilized in this manner. It is not easy to utilize brushes to uniformly clean the desired surface. Further the brushes redistribute contaminants previously accumulated.

Non-woven fabrics can also be used for cleaning sheets for regular surfaces such as those found in the graphic arts industries. Such a non-woven fabric is the Type 532B wiping fabric manufactured by Minnesota Mining and Manufacturing Company (3M), St. Paul, Minn. This wiping fabric may be utilized to trap dust, dirt, lint and other surface contaminants potentially present on the surface to be cleaned.

SUMMARY OF THE INVENTION

The cleaning wiper of the present invention is adapted to hold a roll of cleaning web or cleaning material such as the 3M non-woven wiping fbric described. The wiper has a body having a slot along one side thereof. A support member is movably mounted, and preferably pivotally mounted, within the body with a portion of the support member being accessible, and preferably extending, through the slot. A supply holder is mounted in the body and is adapted to hold a roll of the cleaning web or cleaning material. A take-up holder is also mounted in the body and is adapted to hold a take-up roll for the cleaning web or the cleaning material. The cleaning web passes over a portion of the support member, forming a cleaning surface, between the supply roll and the take-up roll. The support member is resiliently biased within the slot, and an advance linkage is activated by the movement of the support member within the slot and coupled to the take-up holder for advancing the rotation of the take-up holder a predetermined amount. In this manner, the cleaning surface of the cleaning wiper maintains a fresh portion of the cleaning web by automatically advancing the cleaning web as the cleaning wiper is utilized. The cleaning wiper may be utilized by a hand-held wiping motion, or may be mounted for automatic utilization in a processing machine. A cleaning wiper may have a one-way clutch operatively coupled to the take-up holder to prevent its reverse rotation. The cleaning wiper may also have the support member biased toward one side of the slot and where the advance linkage is activated by movement of the support member away from one side of the slot. A support member of the cleaning wiper may have a compressible foam contacting the cleaning web at the cleaning surface to ensure conformability of the cleaning web to the surface to be wiped.

A cleaning wiper so constructed provides a mechanism which automatically advances a non-woven wiping fabric to maintain a fresh wiping surface at the cleaning surface automatically as the cleaning wiper is utilized. With each pass over the surface to be cleaned a fresh portion of the cleaning web is exposed to ensure that prior contaminants collected by the cleaning web are not redeposited to the material to be cleaned.

BRIEF DESCRIPTION OF THE DRAWINGS

The foregoing advantages, construction and operation of the present invention will become more readily apparent in the following description and accompanying drawings in which.

DESCRIPTION OF THE PREFERRED EMBODIMENTS

Figure 1:
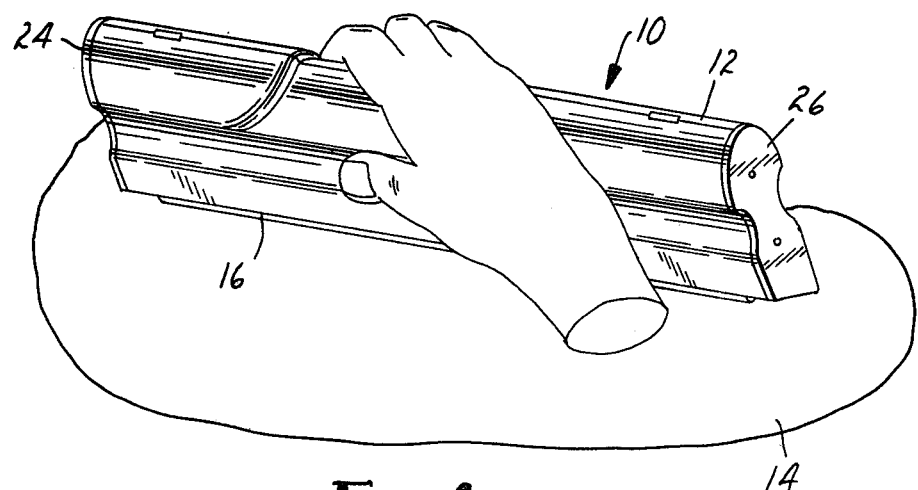
FIG. 1 is a perspective showing the cleaning wiper in use.

FIG. 1 shows the cleaning wiper 10 having a body 12 including end members 24 and 26 which is being hand-held and manually wiped over a surface 14 to be cleaned. A cleaning web 16 is passed over a support member 18 which extends through a slot 20 in the body 12.

Figure 2:
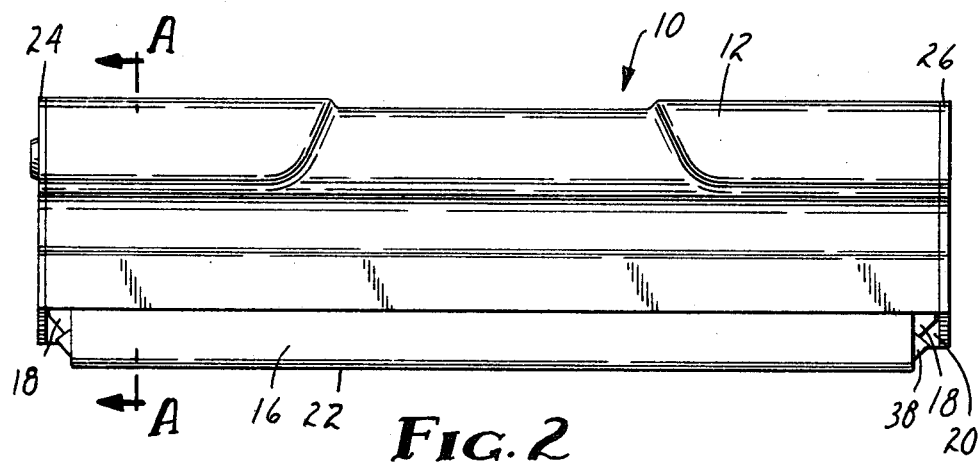
FIG. 2 is a front elevational view of the cleaning wiper.

FIG. 2 shows a front elevational view of the same cleaning wiper 10. Again, the body 12 is formed for hand-held use and has a slot 20 extending along one side. A support member 18, or wiper blade, extends through slot 20. The cleaning web 16 is shown being supported by support member 18 forming a cleaning surface 22. End members 24 and 26 are shown included in the body 12 structure.

Figure 3:
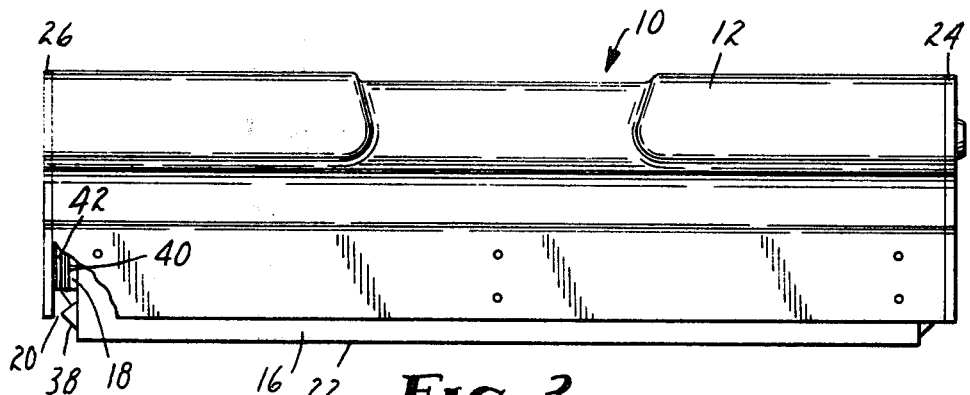
FIG. 3 is a rear elevational view of the cleaning wiper.

FIG. 3 shows a rear view of the cleaning wiper 10 again illustrating the body 12, cleaning web 16, support member 18, slot 20, cleaning surface 22, and end members 24 and 26.

It is to be understood that while the cleaning wiper 10 is shown having a body 1 which is adapted for hand-held use, the cleaning wiper 10 could also very advantageously be adapted for a machine mounted installation.

Figure 4:
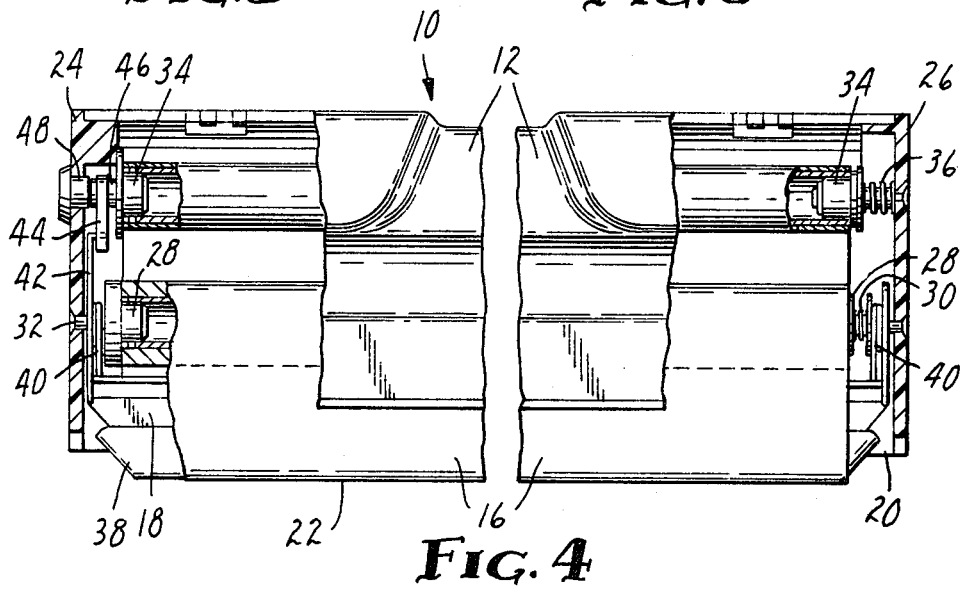
FIG. 4 is a cut-away elevational view of the cleaning wiper showing its internal construction.

FIG. 4 illustrates an elevational view of the cleaning wiper 10 which has been partially cut away to show its internal components. A supply holder 28 is shown mounted within the body 12 for holding a roll of cleaning web 16. The supply roll of the cleaning web 16 is held within the supply holder 28 with a spring 30. A slot 20 is shown along one side of the body 12. Support member 18 is shown pivotally mounted to the body 12 at the same pivot point 32 as the supply holder 28. Support member 18 extends through slot 20. Cleaning web 16 from the roll positioned in the supply holder 28 is passed over support member 18 forming a cleaning surface 22. The cleaning web 16 then passes to a roll mounted in a take-up holder 34 mounted in the body 12. The roll of cleaning web 16 is held in the take-up holder 34 by a spring 36. The support member 18 is covered with a compressible foam 38 at the point where the cleaning web 16 passes over the cleaning surface 22.

Springs 40 resiliently bias support member 18 to one side of the slot 20. Lever arms 42 and 44 along with one-way clutches 46 and 48 form an advance linkage. Lever arm 42 is mounted to support member 18 and cooperates with lever arm 44, which is mounted to the take-up holder 34. One-way clutch 46 is coupled between the take-up holder 34 and lever arm 44 allowing advance rotation but preventing reverse rotation. For purposes described herein, advance rotation means that the roll held in the take-up holder 34 is gathering or gaining cleaning web 16b while the opposite is true for the reverse rotation. One-way clutch 48 is coupled between the supply holder 34 and the body 12. One-way clutch 48 is also described to allow advance rotation, but to prevent reverse rotation.

In typical operation, support member 18 is moved away from the side of the slot 20 to which it is resiliently biased by springs 40 by the wiping motion of the cleaning wiper 10 against the surface 14 (not shown) to be cleaned. As support member 18 pivots, lever arm 42 cooperates with lever arm 44 to allow lever arm 44 to pivot about the axis mounting the take-up holder 34. One-way clutch 46 allows this advance rotation. When the wiping motion of the cleaning wiper 10 is completed, support arm 18 is allowed to return to its resiliently biased position and lever arms 42 and 44 return to their at-rest position. As lever arm 44 returns, one-way clutch 46 causes take-up holder 34 to rotate with lever arm 44 advancing the rotation of the take-up holder 34 causing the cleaning web 16 to move across support arm 18 to supply a fresh portion of the cleaning web 16 to the cleaning surface 22. One-way clutch 48 cooperates between the take-up holder 34 and the body to prevent reverse rotation of the take-up holder 34 as lever arm 44 is advanced.

Figure 5:
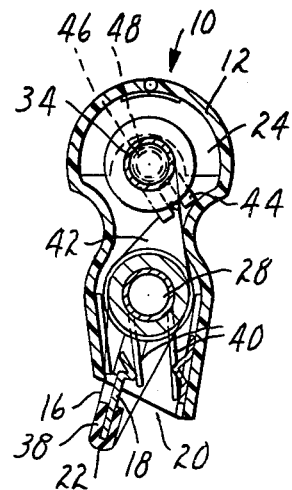
FIG. 5 is an end cross-sectional view of the advance linkage with the support member at rest.

This advance linkage can be more clearly illustrated by reference to FIGS. 5 and 6 which are a cross-sectional end view taken from Section A—A of FIG. 2. In FIG. 5, supply holder 28 and take-up holder 34 are mounted within body 12. Support member 18 pivots around the same pivot point as supply holder 28 and extends through slot 20. Lever arm 42 is mounted to support member 18 and cooperates with lever arm 44 which is coupled through one-way clutch 46 to take-up holder 34. Additionally, take-up holder 34 is coupled through one-way clutch 48 to body 12.

In FIG. 5, support arm 18 is resiliently biased against the left side of slot 20 forcing lever arms 42 and 44 to the right. In FIG. 6, support member 18 has been forced to the right in slot 20 by the wiping action of the cleaning wiper 10 against the surface 14 (not shown) to be cleaned. Lever arms 42 and 44 have been forced to the left. One-way clutch 46 has allowed lever arm 44 to rotate with respect to take-up holder 34. When the wiping action of the cleaning wiper 10 is completed, support member 18 is allowed to return to its position in FIG. 5. As lever arms 42 and 44 move back to their original position at the right, one-way clutch 46 forces take-up holder 34 to rotate with lever arm 44, causing take-up holder 34 to advance in the forward direction and pull the cleaning web 16 around the support memeber 18 and from the supply holder 28. One-way clutch 48 is coupled between the take-up holder 34 and the body 12 prevents the reverse rotation of take-up holder 34.

Figure 6:
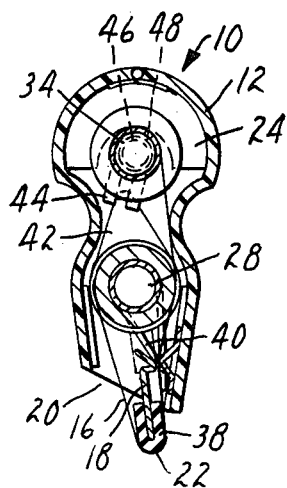
FIG. 6 is an end cross-sectional view of the advance linkage with the support member activated.

In a preferred embodiment it is contemplated that the advance linkage would advance the cleaning web 16 approximately 1/16 of an inch (0.79 mm) each time the advance linkage is activated from the position in FIG. 5, to the position in FIG. 6, and returning to the position in FIG. 5.

It is to be understood that while the preferred embodiment illustrated in FIGS. 1 through 6 show the support member 18 extending through slot 20 such that the cleaning surface 22 is external to the body 12, this is not required for proper operation of the cleaning wiper 10. It is only required that the edge of the support member 18 forming the cleaning surface 22 be accessible to the surface 14 to be cleaned. A configuration where this would be the case would be a cleaning wiper 10 specifically constructed for wiping or cleaning a circular drum. The radius of curvature of the drum would provide the accessibility to the cleaning surface 22 within the slot 20 even though the support member 18 did not extend beyond the slot 20.

It is also to be understood that the slot 20 need not be the elongated opening illustrated in the preferred embodiment of FIGS. 1 through 6. It is only required that the slot 20 form an opening in the body 12 to make the support member 18 accessible to the surface 14 to be cleaned. The slot 20 for purposes defined herein shall mean any opening which provides accessibility of the support member 18. It is contemplated that the slot 20 could form a square, round, or other shaped opening as well as the elongated opening illustrated.

It is also to be understood that while the support member 18 is illustrated to be pivotally mounted within the body 12 and activated from one side of the slot 20 to the other side of the slot by the wiping action of the cleaning wiper 10 that other embodiments are specifically contemplated. These other embodiments specifically include the case where the support member 18 is resiliently biased in an intermediate position within the slot 20 and could then be activated by wiping in either or both directions against either or both sides of the slot 20. It is only required that the support member 18 be movably mounted within the body 12 so that it may be activated by movement of the cleaning wiper 10. While a pivotable mount is illustrated in FIGS. 1 through 6 for a preferred embodiment, a slidable or other movable mount also would be operable. It is also contemplated that a movement other than a side-to-side wiping movement of the cleaning wiper 10 would activate the advance linkage by moving the support member 18. An example would be a vertical movement of the support member 18 when the cleaning surface 22 is engaged with the surface 14 to be cleaned.

It is also to be understood that while the preferred embodiment illustrated in FIGS. 1 through 6 shows a separate roll of cleaning web material coupled to the supply holder 28 and a separate roll coupled to the take-up holder 34, that it is specifically contemplated that the cleaning web 16 could be encased within a cassette containing the supply rolls and the take-up rolls. In this embodiment, the supply rolls within the cassette would engage with the supply holder 28 and the take-up roll within the cassette would engage with the take-up holder 34.

While not specifically part of the present invention, it is anticipated and preferred that the cleaning wiper 10 be utilized with a non-woven wiping fabric. An example of a wiping fabric which could be utilized is Type 532B wiping fabric manufactured by Minnesota Mining and Manufacturing Company, Saint Paul, Minn. This particular wiping fabric is comprised of a 50% cellulose acetate and a 50% rayon combined with a binder and having a nominal weight of 15 pounds per ream, minimum 12 pounds per ream and maximum 18 pounds per ream (with a tensile strength of nominal 3 pounds per inch) minimum 2 pounds per inch.

Thus, it can be seen that there has been shown and described a novel cleaning wiper. It is to be understood, however, that various changes, modifications and substitutions in the form and details of the described wiper can be made by those skilled in the art without departing from the scope of the invention as defined by the following claims.

What is claimed is:

1. A cleaning wiper adapted to hold a roll of cleaning web, comprising:
   a body having a slot along one side thereof;
   a support member movably mounted within said body, a portion of which is accessible through said slot;
   a supply holder mounted in said body adapted to hold said roll of said cleaning web;
   a take-up holder mounted in said body adapted to hold a take-up roll for said cleaning web;
   said cleaning web when intermediate said supply roll and said take-up roll passing over said portion of said support member forming a cleaning surface;
   said support member being resiliently biased within said slot; and
   an advance linkage activated by movement of said support member within said slot and coupled to said take-up holder for advancing the rotation of said take-up holder a predetermined amount;
   whereby said cleaning surface maintains a fresh portion of said cleaning web by automatically advancing said cleaning web as said cleaning wiper is utilized.

2. A cleaning wiper as in claim 1 which further comprises a one-way clutch operatively coupled to said take-up holder.

3. A cleaning wiper as in claim 1 wherein said portion of said support member extends through said slot.

4. A cleaning wiper as in claim 3 wherein said support member is pivotably mounted within said body.

5. A cleaning wiper as in claim 4 wherein said support member is biased toward one side of said slot and wherein said advance linkage is activated by a movement of said support member away from said one side of said slot.

6. A cleaning wiper as in claim 5 wherein said support member is pivotably mounted on the axis of said supply holder.

7. A cleaning wiper as in claim 6 wherein said advance linkage comprises:
   a first lever mounted on the axis of said supply holder and fixed with respect to said wiper blade;
   a second lever mounted on the axis of said take-up holder engaging said first lever;
   a first one-way clutch mounted on the axis of said take-up holder operatively coupling said second lever with said take-up holder; and
   a second one-way clutch mounted on the axis of said take-up holder operatively coupling said take-up holder to said body.

8. A cleaning wiper as in claim 8 wherein said support member has compressible foam contacting said cleaning web.

* * * * *